United States Patent
Miyazaki et al.

(10) Patent No.: US 7,281,931 B2
(45) Date of Patent: Oct. 16, 2007

(54) ELECTRICAL CONNECTOR FOR CONNECTING ELECTRICAL UNITS, ELECTRICAL DEVICE, AND PRODUCTION METHOD FOR PRODUCING ELECTRICAL DEVICE

(75) Inventors: Nagao Miyazaki, Osaka (JP); Yoshihiko Suzuki, Izumi (JP)

(73) Assignees: Japan Electronics Industry Ltd. (JP); Osaka Prefecture (JP)

( * ) Notice: Subject to any disclaimer, the term of this patent is extended or adjusted under 35 U.S.C. 154(b) by 628 days.

(21) Appl. No.: 10/897,465

(22) Filed: Jul. 23, 2004

(65) Prior Publication Data
US 2005/0033125 A1    Feb. 10, 2005

(30) Foreign Application Priority Data
Jul. 28, 2003    (JP) .............................. 2003-202198

(51) Int. Cl.
*H01R 4/58*    (2006.01)
(52) U.S. Cl. ...................................................... 439/91
(58) Field of Classification Search .................. 439/91, 439/66; 174/88 R, 94 R; 349/150, 149, 349/200; 73/146, 118.1
See application file for complete search history.

(56) References Cited

U.S. PATENT DOCUMENTS

| | | | | |
|---|---|---|---|---|
| 4,113,981 A | * | 9/1978 | Fujita et al. ............... | 174/88 R |
| 4,737,112 A | * | 4/1988 | Jin et al. ....................... | 439/66 |
| 4,832,455 A | * | 5/1989 | Takeno et al. ............... | 349/149 |
| 4,917,466 A | * | 4/1990 | Nakamura et al. .......... | 349/151 |
| 4,964,700 A | * | 10/1990 | Takabayashi ................ | 349/200 |
| 4,999,460 A | * | 3/1991 | Sugiyama et al. ......... | 174/94 R |
| 5,001,302 A | * | 3/1991 | Atsumi ..................... | 174/94 R |
| 5,029,984 A | * | 7/1991 | Adachi et al. .............. | 349/150 |
| 5,180,888 A | | 1/1993 | Sugiyama et al. | |
| 5,186,042 A | * | 2/1993 | Miyazaki .................... | 73/118.1 |
| 5,586,892 A | | 12/1996 | Sato | |
| 6,138,505 A | | 10/2000 | Miyazaki | |
| 6,909,180 B2 | * | 6/2005 | Ono et al. ................... | 257/734 |
| 2005/0153599 A1 | * | 7/2005 | Wu et al. .................... | 439/591 |

FOREIGN PATENT DOCUMENTS

| | | |
|---|---|---|
| JP | 04-331336 | 11/1992 |
| JP | 08-086707 | 4/1996 |

* cited by examiner

*Primary Examiner*—Chandrika Prasad
(74) *Attorney, Agent, or Firm*—Gerald E. Hespos; Anthony J. Casella

(57) ABSTRACT

In a construction for electrically connecting electrical unit with joint surfaces thereof opposed to each other, wiring patterns electrically connected with distortion gauges are formed on function-element forming surfaces of each electrical three-dimensional unit and are extended to edge portions formed between the function-element forming surfaces and adjacent wiring surfaces as the joint surfaces to form first lands; second lands extending from the edge portions by a specified distance are formed at positions of the wiring surfaces corresponding to the first lands; and electrical connectors displaying a joining performance upon being pressed together are formed to bridge the first and second lands while being held in close contact with the first and second lands. A plurality of three-dimensional electrical unit can be securely and easily electrically connected with each other with high precision.

16 Claims, 6 Drawing Sheets

ELECTRICAL CONNECTOR FOR CONNECTING ELECTRICAL UNITS, ELECTRICAL DEVICE, AND PRODUCTION METHOD FOR PRODUCING ELECTRICAL DEVICE

BACKGROUND OF THE INVENTION

1. Field of the Invention

This invention relates to an electrical connector for electrically connecting electrical units, an electrical device, and a production method for producing an electrical device, in particular to a three-dimensional electrical device taking a rectangular parallelepipedic shape and provided at specified positions with electrical function elements such as stress detecting elements represented by distortion gauges and various integrated circuits.

2. Description of the Related Art

Japanese Patent No. 2736395 shows a stress detecting sensor which includes an electrical three-dimensional unit having a rectangular parallelepipedic shape and at least the outer surface thereof made of an electrically nonconductive material, and distortion gauges made of metal resistor foils or a semiconductor elements and formed on the respective surfaces of the electrical three-dimensional unit. Such a stress detecting sensor is embedded in a structure for which an internal stress is to be measured such as an axle of a vehicle. Distortion signals outputted from signal lines drawn out from the respective distortion gauges are calculated by a specified arithmetic circuit, whereby a stress occurred inside the structure can be precisely detected. By using such a stress detecting sensor, detection precision is remarkably improved as compared to a conventional stress detecting method according to which distortion gauges are adhered to outer surfaces of the structure. Thus, attention is paid to the application of such a stress detecting sensor, for example, to an axle of a vehicle since a very precise ABS (anti-braking system) control can be realized.

Such a stress detecting sensor in which the distortion gauges are attached to the respective surfaces of the electrical three-dimensional unit can fully display its function even when only one sensor is provided. However, if a plurality of stress detecting sensors are linearly connected into a long line or two-dimensionally connected to span in a plane or three-dimensionally connected to span in a space, the obtained integrated assembly of the stress detecting sensors has advantages of being able to conform to the shape of a structure to be measured and suitably detect an internal stress and geometrically progressively improving detection precision. As an example, an assembly of stress detecting sensors is shown in Japanese Patent No. 3131642.

Electrical connection of three-dimensional detecting sensors into an integrated assembly has been conventionally made by forming land portions of wiring patterns on the respective surfaces at respective corner portions or ridge portions of each three-dimensional detecting sensor, and placing connection pads made of, e.g., gold on these land portions, subsequently applying a high-temperature heating treatment while the connection pads of the three-dimensional detecting sensors are held in contact with each other to thereby connect the connection pads.

However, since a plurality of stress detecting sensors held in contact with each other are heated at high temperatures according to the conventional method, there are problems that voids or holes are formed in the synthetic resin material forming the body of the three-dimensional detecting sensor due to the fact that gold forming the connection pads and aluminum forming the land portions come into a mixture or an alloy and the alloy then grows, and the heated three-dimensional detecting sensor made of the synthetic resin is consequently deteriorated due to heat corrosion, and the electrical function elements mounted on the three-dimensional detecting sensor are adversely affected.

SUMMARY OF THE INVENTION

It is an object of the present invention to provide an electrical connector which makes it possible to overcome the problems residing in the prior art.

It is another object of the present invention to provide an electrical device and a production method for producing an electrical device which are free from the problems residing in the prior art.

According to an aspect of the invention, an electrical connector is comprised of a conductive body made of a conductive material. The conductive body has a land contact surface operable to come into contact with a land formed at an end of a wiring. An adhesive layer is provided on a surface opposite to the land contact surface. The adhesive layer is operable to expose a conductive adhesive owing to an external force.

An electrical unit includes a rectangular main body. The main body is formed with wiring patterns each having a land near an edge thereof. An electrical connector is attached on the lands for electrically connecting the wiring patterns.

An electrical device is constructed by arranging such electrical units in a desired formation, and pressing them to each other to connect them to each other.

These and other objects, features and advantages of the present invention will become more apparent upon a reading of the following detailed description and accompanying drawings.

BRIEF DESCRIPTION OF THE DRAWINGS

FIGS. 5A and 5B are enlarged diagrams showing essential portions of the three-dimensional electrical units for the explanation of the function of the adhesive retaining particles, wherein FIG. 5A shows a state where one electrical three-dimensional unit is approaching the other and FIG. 5B shows a state where the respective electrical connectors of the three-dimensional electrical units are held in contact via the broken adhesive retaining particles;

FIG. 6A to 6D are perspective views showing electrical devices according to an embodiment of the present invention, wherein FIG. 6A shows a linearly arranged integrated assembly of four (1×4) three-dimensional electrical units, FIG. 6B shows a two-dimensionally arranged integrated assembly of eight (2×4) three-dimensional electrical units, FIG. 6C shows a two-dimensionally arranged integrated assembly of four (2×2) three-dimensional electrical units and FIG. 6D shows a three-dimensionally arranged integrated assembly of eight (2×2×2) three-dimensional electrical units.

DETAILED DESCRIPTION OF THE PREFERRED EMBODIMENTS OF THE INVENTION

Figure 1:
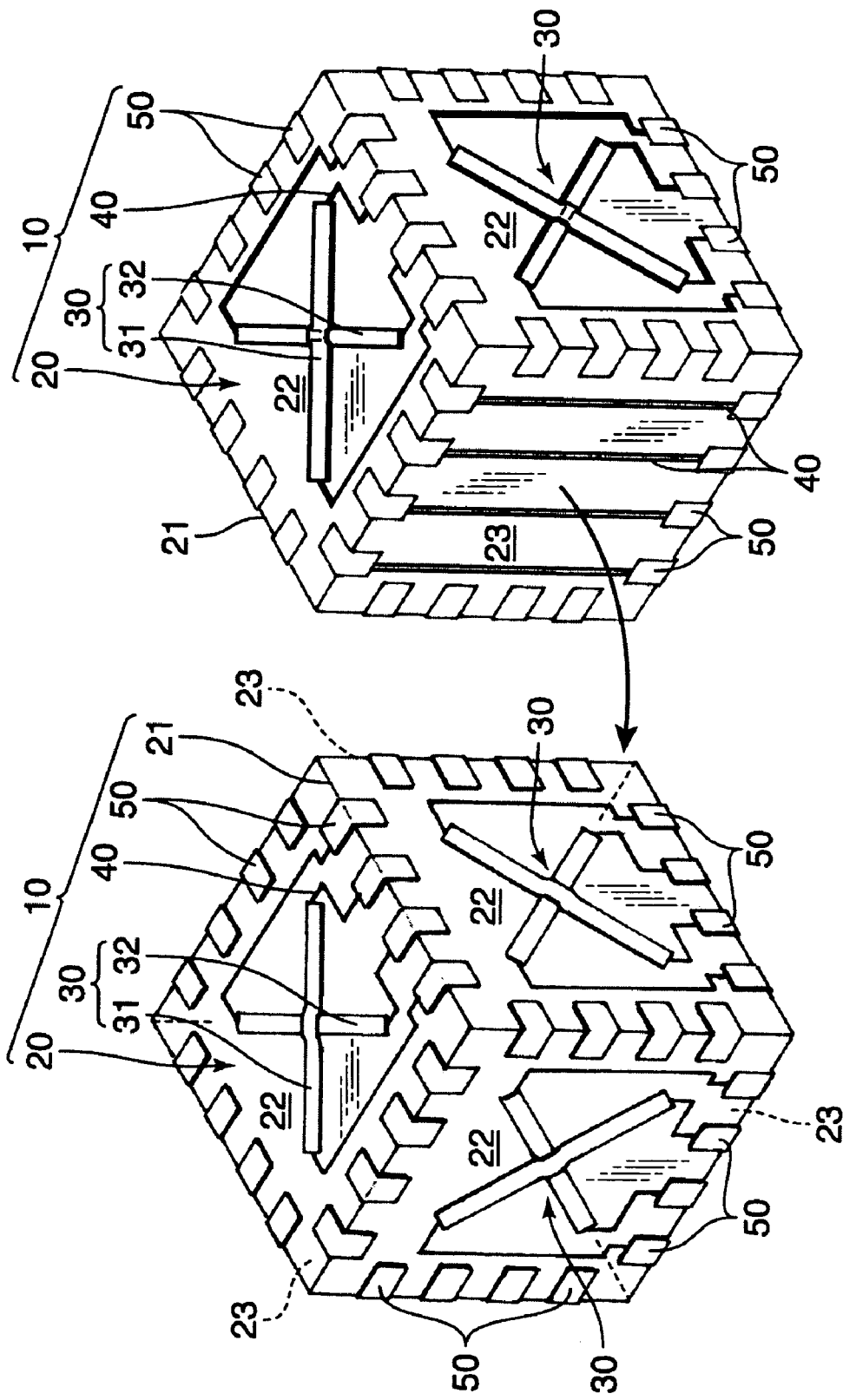
FIG. 1 is a perspective view of two three-dimensional electrical units according to an embodiment of the present invention showing a state before the two three-dimensional electrical units are connected.
Figure 2:
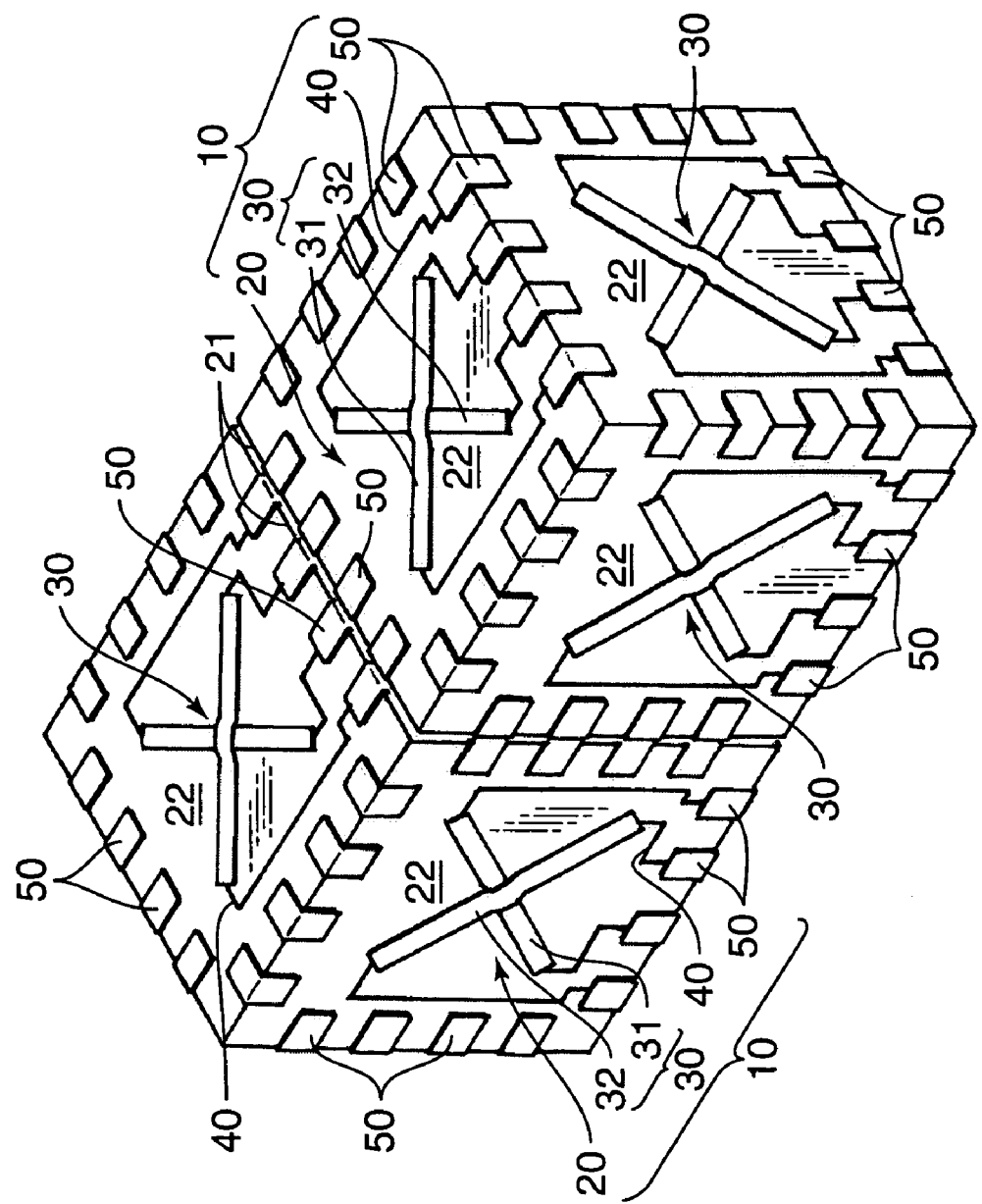
FIG. 2 is a perspective view of the two three-dimensional electrical unit showing a state where they are connected with each other.

Referring to FIGS. 1 and 2 showing three-dimensional electrical units according to an embodiment of the invention, the three-dimensional electrical units 10 are units of the so-called cubic sensor for detecting a stress. As shown in FIG. 1, the electrical three-dimensional unit 10 has such a basic construction comprised of a main body 20 taking a rectangular parallelepipedic shape, electrical function elements or distortion gauges 30 having a function of stress detection which are attached to specified surfaces of the main body 20, wiring patterns 40 drawn out from the distortion gauges 30 on the outer surfaces of the main body 20, and electrical connectors 50 provided to cross over edge portions 21 of the main body 20 and electrically connected with the wiring patterns 40.

In this embodiment, the main body 20 is a small-sized element formed of an electrically nonconductive material containing a hard synthetic resin such as a polyethylene terephthalate or a polyvinyl chloride, and takes a cubic shape one side of which is set at 1 to 5 mm. The present invention is not limited to the cubic shape and the main body 20 can take various shapes including a shape of a flat rectangular parallelepiped. Also, the present invention is not limited to the main body 20 made of the electrically nonconductive material. The main body 20 may be made of a metallic material such as a stainless steel and have the outer surfaces thereof covered by coatings made of an electrically nonconductive material. Coatings made of a silicon oxide or silicon nitride are suitably used. Further, one side of the small-sized three-dimensional main body 20 is not limited to the above dimensions. Various dimensions can be set according to applications and situations.

Six surfaces of the main body 20 are divided into function-element forming surfaces 22 where the distortion gauges 30 are provided and wiring surfaces 23 on which only the wiring patterns 40 are provided for the connection with other main bodies 20 without providing the distortion gauge 30 (in some cases, no wiring pattern 40 may be provided). In an example shown in FIG. 1, the function-element forming surfaces 22 are formed on three shown surfaces orthogonal to each other and the wiring surfaces 23 are set on the remaining three surfaces not shown in FIG. 1 of the main body 20 shown at the left side. For the electrical three-dimensional unit 10 shown at the right side in FIG. 1, the wiring surface 23 is set on the shown left surface.

The present invention is not limited to the wiring surfaces 23 on which no electrical function element is provided, and various electrical function elements may be provided depending on the situations. Such electrical function elements include, for example, noise removing circuits formed by semiconductors, and amplifying circuits for amplifying detection signals.

The distortion gauges 30 detect a slight deformation of the main body 20 according to a change of a stress in a specified structure with the electrical three-dimensional unit 10 embedded in this structure and output the detected deformation in the form of an electrical signal. The distortion gauges 30 are made of metallic resistor foils or semiconductors. Each distortion gauge 30 is comprised of a first distortion gauge 31 arranged on a straight line connecting one vertex of the function-element forming surface 22 and a vertex diagonal from this vertex and a second distortion gauge 32 crossing the first distortion gauge 31 at right angles and arranged on a straight line passing a center position of the function-element forming surface 22. By forming the distortion gauge 30 to be cross-shaped, a stress created in the structure to be measured in a direction parallel to the function-element forming surface 22 can be detected with high precision.

The wiring patterns 40 are adapted to electrically connect the respective ends of the first and second distortion gauges 31, 32 with the electrical connectors 50 or to electrically connect one electrical connector 50 and the other electrical connector 50 without any distortion gauge 30 therebetween, and are formed by an electrically conductive material such as aluminum, nickel or copper.

A land 41 serving as a contact is comprised of a first land 42 and a second land 43. The first land 42 is formed at an end portion of a wiring pattern 40 on the function-element forming surface 22. The second land 43 is formed at an end portion of a wiring pattern 40 on the wiring surface 23.

In this embodiment, four first and second lands 42, 43 are provided for each edge portion 21. However, the number of first and second lands 42, 43 for each edge portion 21 is not limited to four, and one, two, three, five or more may be provided depending on the application of the electrical three-dimensional unit 10 and the situation. Further, there may exist the edge portion 21 provided with neither first nor second land 42, 43. In this embodiment, the first or second lands 42, 43 are provided at the positions of all the edge portions 21 of each surface. Such lands 41 are formed of the same material as the wiring patterns 40 to be wider than the wiring patterns 40 in this embodiment.

Each electrical connector 50 is used to electrically and structurally connect three-dimensional electrical units 10 with each other, and is L-shaped in side view as to cross over the first land 42 formed on the surface of the main body 20 at one side of the edge portion 21 and the second land 43 formed on the surface at the other side of the edge portion 21.

The electrical connector 50 is made of gold or an indium-tin alloy in this embodiment. However, the material of the electrical connector 50 is not limited to gold or an indium-tin alloy according to the present invention, and various metal materials which can be easily united upon being pressed with a suitable pressure can be adopted.

Using such a metal material as a raw material, known deposition or plating is applied to the main body 20 while targeting at the respective lands 41, thereby forming the electrical connectors 50.

Figure 3:
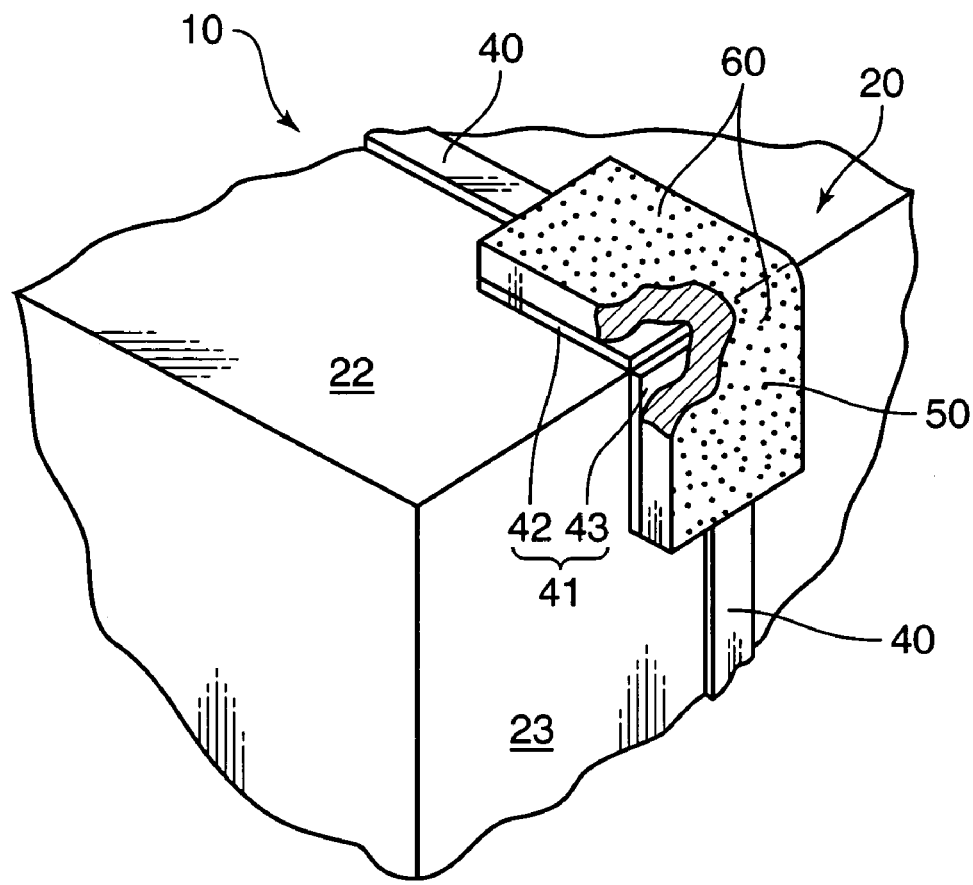
FIG. 3 is an enlarged perspective view partly cut away showing an electrical connector according to an embodiment of the present invention.
Figure 4:
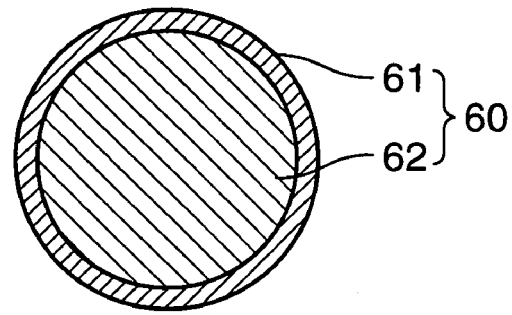
FIG. 4 is a section showing an adhesive retaining particle, imparted to an outer surface of the electrical connector.

FIG. 3 is an enlarged perspective view partly cut away showing the electrical connector 50, and FIG. 4 is a section showing an adhesive retaining particle 60 imparted to the outer surface of a body of the electrical connector 50. First, as shown in FIG. 3, the adhesive retaining particles 60 in the form of a ball are so imparted to the outer surface of the body of the electrical connector 50 as to form a layer. Each adhesive retaining particle 60 is minute and has a diameter of from several μm to several tens μm (about 5 μm in this embodiment), and is comprised of a cover 61 made of a specified material (e.g. silica particle) and a known conductive adhesive 62 (e.g. silver paste, carbon paste). It should be noted that the size of the adhesive retaining particle 60 is shown in an exaggerated manner in FIG. 3.

The adhesive retaining particle 60 is produced by an interface deposition method of depositing a cover material (e.g. silica particles) on an outside surface of a conductive adhesive 62, or an interface reaction method of forming a film using a chemical reaction on an outside surface of a conductive adhesive 62.

The adhesive retaining particles 60 are imparted to the outer surface of the body of the electrical connector 50 by ordinary printing (ink-jet method, etc.) or transfer. Alternatively, the adhesive retaining particles 60 may be injected or applied to the outer surface of the body of the electrical connector 50 which is already applied with an adhesive.

The adhesive retaining particles 60 are easy to break upon being pressed at a specified pressure or upon being vibrated, whereby the conductive adhesive 62 inside leaks. Vibration may be given by a specified vibrator. However, it is quite effective to supply ultrasonic waves to the three-dimensional electrical unit 10.

The adhesive retaining particles 60 are easy to break upon being pressed at a specified pressure, or alternatively a specified pressure and a vibration, whereby the conductive adhesive 62 inside leaks. Vibration may be given by a specified vibrator. However, it is quite effective to supply ultrasonic waves to the three-dimensional electrical unit 10.

Alternatively, a coat of electrically conductive adhesive may be applied on an outer surface of an electrical connector 50 to form an adhesive layer in place of the layer of adhesive retaining particles 60, and then applied with a cover to keep the conductive adhesive from exposing. The cover is removable by an external force, for example, removal by hands. The conductive adhesive has the property of performing adhesion at a room temperature as those mentioned above.

Figure 5A:
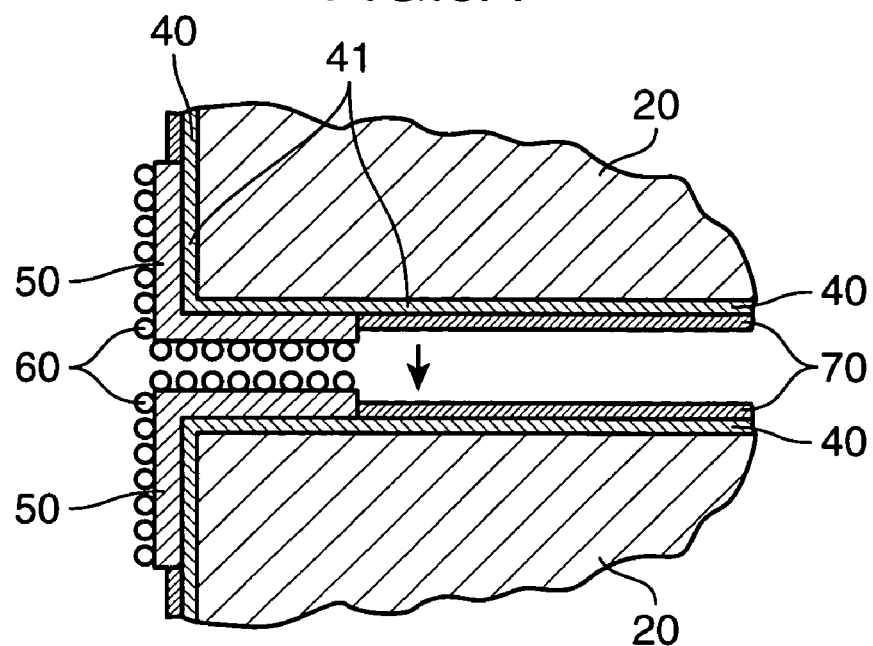
Figure 5B:
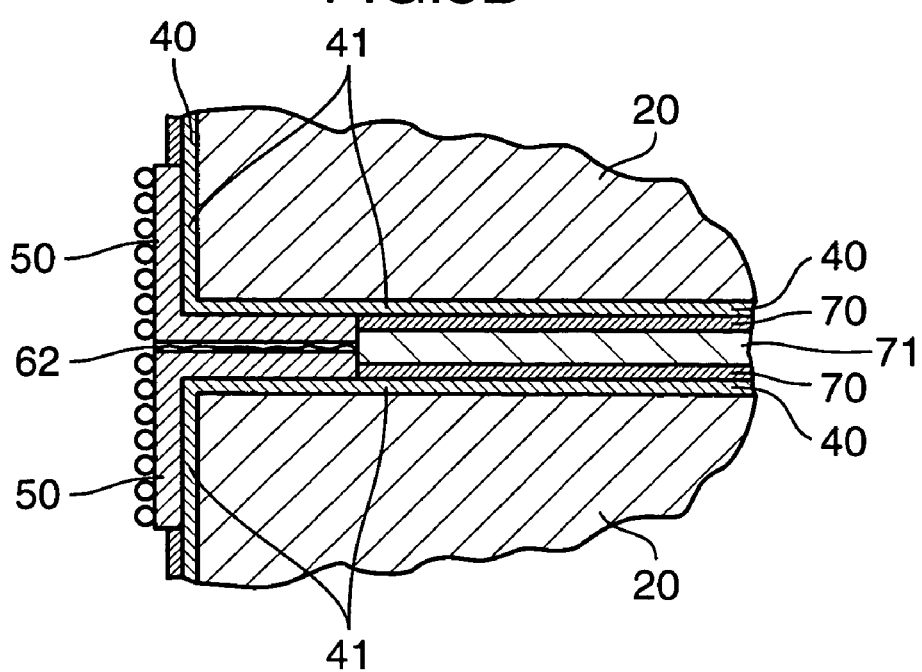

Referring to FIGS. 5A and 5B connection of three-dimensional electrical units 10, one electrical three-dimensional unit 10 is pressed toward the other electrical three-dimensional unit 10 as shown in FIG. 5A while being opposed thereto (in some cases, vibration is given while the electrical three-dimensional unit 10 is pressed), whereby the covers 61 of the adhesive retaining particles 60 are broken and the conductive adhesive 62 inside leaks. Thus, the electrical connectors 50 opposed to each other are adhered to each other by the leaked conductive adhesive 62 as shown in FIG. 5B. As a result, the respective three-dimensional electrical units 10 adjacent to each other are electrically connected with each other and become structurally integral by the adhesive force of the conductive adhesive 62.

Protection layers 70 may be formed on the outer surfaces of the electrical three-dimensional unit 10 as shown in FIGS. 5A and 5B. A film of silicon oxide or silicon nitride is used as the protection layer 70. The protection layers 70 are not formed on the electrical connector 50 in order to ensure electrical conductivity. By the presence of such protection layers 70, the distortion gauges 30 and the wiring patters 40 formed on the outer surfaces of the main bodies 20 can be protected from external forces during the production process of the three-dimensional electrical unit 10 and during the assembling of integrated assemblies 80 to be described later.

In this embodiment, an insulating material 71 is filled between the protection layers 70 with the adjacent three-dimensional electrical units 10 connected with each other by the adhesion of the electrical connectors 50 opposed to each other as shown in FIG. 5B. For example, an epoxy resin is suitably used as the insulating material 71. Specifically, an epoxy resin in the form of a viscous fluid is injected into a clearance between the opposing main bodies 20. By the solidification of the epoxy resin after the injection, the respective three-dimensional electrical units 10 are firmly united to have such a rigidity that a stress can be transmitted. Therefore, the obtained integrated assembly 80 to be described later can suitably serve as a stress detecting sensor or electrical device.

Figure 6A:
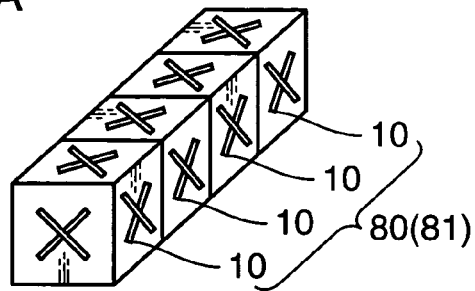

Referring to FIGS. 6A to 6D showing four kinds of electrical devices, an linearly arranged integrated assembly or electrical device 81 shown in FIG. 6A is formed by applying a specified pressure to four linearly arranged three-dimensional electrical units while giving a mechanical micro vibration thereto from the opposite longitudinal ends by ultrasonic vibration given from a specified ultrasonic oscillator. The linearly arranged integrated assembly 81 is suited to detecting an internal stress when a structure to be measured is an elongated bar.

Figure 6B:
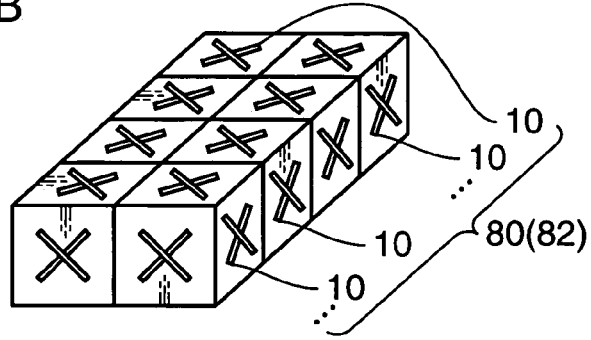

A two-dimensionally arranged integrated assembly 82 shown in FIG. 6B is formed by juxtaposing two linearly arranged integrated assemblies 81 of FIG. 6A in widthwise direction. The two-dimensionally arranged integrated assembly 82 is suited to detecting an internal stress when a structure to be measured is a wide elongated material.

Figure 6C:
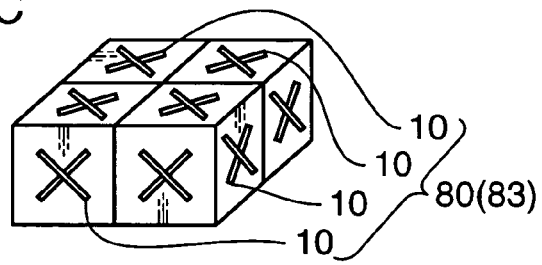

A two-dimensionally arranged integrated assembly 83 shown in FIG. 6C is formed by arranging four three-dimensional electrical unit 10 in such a manner as to take a square shape in plan view. The two-dimensionally arranged integrated assembly 83 is suited to detecting an internal stress when a structure to be measured is a plate-shaped material.

Figure 6D:
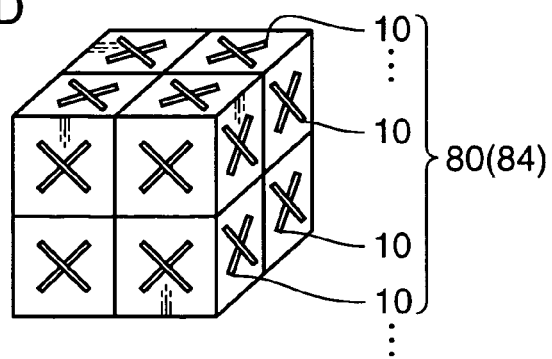

A three-dimensionally arranged integrated assembly 84 shown in FIG. 6D is formed by placing two two-dimensionally arranged integrated assemblies 83 of FIG. 6C one over the other. The three-dimensionally arranged integrated assembly 84 is suited to detecting an internal stress when a structure to be measured is a bulk material.

In this embodiment, the four types of integrated assemblies 81 to 84 are shown. However, other optimal integrated assembly 80 can be suitably assembled depending on the shape, the using situation, the size and the like of a structure to be measured.

As described in detail above, the electrical connection of the three-dimensional electrical units 10 is designed to be such that the three-dimensional electrical units 10 each taking a substantially rectangular parallelepipedic shape, provided with the distortion gauges 30 as electrical function elements at specified positions and having at least the outer surfaces thereof made of the electrically nonconductive material are electrically connected while the joint surfaces thereof to be joined are opposed to each other. The wiring patterns 40 electrically connected with the distortion gauges 30 are formed on the function-element forming surfaces 22 of the three-dimensional electrical units 10, and these wiring patterns 40 are extended to the edge portions 21 formed between the function-element forming surfaces 22 and the wiring surfaces 23 adjacent to the function-element forming surfaces 22 and serving as the joint surfaces, thereby forming the first lands 42. Further, the second lands 43 are formed over a specified distance from the edge portions 21 at positions of the wiring surfaces 23 corresponding to the first lands 42. The electrical connectors 50 for displaying a joining performance upon being pressed are formed to bridge the first and second lands 42, 43 while being held in close contact therewith.

Accordingly, if the function-element forming surface 22 or the wiring surface 23 of one electrical three-dimensional unit 10 and the function-element forming surface 22 or the wiring surface 23 of the other electrical three-dimensional unit 10 are opposed to each other, and the respective three-dimensional electrical unit 10 are pressed in directions toward each other with the opposing electrical connectors 50 thereof held in contact with each other, the connection layers held in contact are joined with each other since the electrical connectors 50 are made of such a material as to display a joining performance upon being pressed. As a result, the respective three-dimensional electrical unit 10 can be electrically and structurally connected with each other via the connection layers.

With the adjacent three-dimensional electrical unit 10 united, signals outputted from the distortion gauges 30 provided on the function-element forming surfaces 22 of one electrical three-dimensional unit 10 are transmitted to the other electrical three-dimensional unit 10 via the wiring patterns 40, the first lands 42 at the leading ends of the wiring patterns 40 and the electrical connectors 50. Thus, one and the other three-dimensional electrical unit 10 can be united such that signals can be transmitted to and received from each other.

A plurality of three-dimensional electrical units 10 are united with each other by the easy joint of the respective electrical connectors 50 held in contact by being pressed in directions toward each other, for example, at a temperature around normal temperature instead of being heated as in the prior art. Thus, there is no likeliness of voids and heat corrosion which are caused by heating the three-dimensional electrical units 10, and the distortion gauges 30 mounted on the three-dimensional electrical unit 10 are not adversely affected, with the result that a plurality of three-dimensional electrical unit can be securely electrically connected with each other with high precision.

Further, since the thickness of the electrical connectors 50 is set to be at least larger than that of the electrical function elements, the mutual interference of the distortion gauges 30 mounted on the respective opposing surfaces of the joined three-dimensional electrical unit 10 can be prevented, thereby avoiding bad influences resulting from the mutual interference.

Since the wiring patterns 40 are formed of any one of aluminum, nickel and copper, which are all suitable as the material of the wiring patterns 40, they can be easily and securely formed on the outer surfaces of the three-dimensional electrical units 10. Further, the electrical connectors 50 are formed of gold or an indium-tin alloy, which has such a property as to join with each other upon being pressed into contact even without being placed in a high-temperature atmosphere. Thus, a plurality of three-dimensional electrical units 10 placed side by side in a substantially normal-temperature atmosphere are pressed in such directions as to be brought into close contact, whereby the adjacent three-dimensional electrical units 10 can be easily joined with each other via the electrical connectors 50. Therefore, the operability in connecting the three-dimensional electrical units 10 can be improved.

Further, since the protection layers 70 made of the insulating material are formed on the respective surfaces of the three-dimensional electrical units 10, the distortion gauges 30, the wiring patterns 40 and the like mounted on the outer surfaces of the main bodies 20 can be protected from external forces, whereby damages caused by abrasion or the like can be securely prevented.

The protection layers 70 are made of silicon oxide or silicon nitride. Both silicon oxide and silicon nitride can form a film having a solid reticulate structure by chemical bonding. Thus, the protection layers 70 made of such a material can securely protect the distortion gauges 30 formed on the outer surfaces of the three-dimensional electrical unit 10.

If the adhesive retaining particles 60 containing the conductive adhesive 62 are imparted to the outer surfaces of the electrical connectors 50, the conductive adhesive 62 contained in the adhesive retaining particles 60 flows out to be located between the opposing electrical connectors 50 upon breaking the adhesive retaining particles 60 tightly held between the respective electrical connectors 50 of the adjacent three-dimensional electrical unit 10. Thus, the opposing electrical connectors 50 can be easily united by the adhesion of the conductive adhesive 62. Further, the electrical conductivity between the opposing electrical connectors 50 can be ensured by the conductive adhesive 62.

If such adhesive retaining particles 60 are so specified as to be easily breakable upon being pressed or vibrated, the adhesive retaining particles 60 tightly held between the respective electrical connectors 50 of the adjacent three-dimensional electrical unit 10 can be easily broken by being pressed or vibrated via the respective electrical connectors 50. Thus, the conductive adhesive 62 contained therein can easily flow out.

The integrated assembly or electrical device 80 can be obtained by integrating a plurality of three-dimensional electrical units 10 as above, and formed by bringing the electrical connectors 50 of one electrical three-dimensional unit 10 into contact with those of the other three-dimensional unit 10 and adhering them together to integrate the plurality of three-dimensional electrical units 10. Thus, the three-dimensional electrical units 10 can be linearly, two-dimensionally or three-dimensionally assembled in conformity with the shape of a structure to be measured to build the integrated assembly 80 suited to the structure. Therefore, a geometrically progressive improvement in detection precision which could not be obtained by one electrical three-dimensional unit can be obtained, and items to be detected can increased or a detection range can be enlarged.

In such an integrated assembly 80, the conductive adhesive 62 obtained by the breakage of the adhesive retaining particles 60 is present between the electrical connectors 50 of one electrical three-dimensional unit 10 and those of the other electrical three-dimensional unit 10. Thus, the electrical connectors 50 opposed to each other are united by the adhesion of the conductive adhesive 62, and electrical conductivity between the electrical connectors 50 opposed to each other is ensured by the conductive adhesion 62.

Further, in such-an integrated assembly 80, strong adhering performance is provided and the insulating material 71 made of, e.g. an epoxy resin and being very structurally solid in its solidified state is filled between the one electrical three-dimensional unit 10 and the other electrical three-dimensional unit joined with each other. Thus, the respective three-dimensional electrical unit 10 can be securely united in the integrated assembly 80.

Since the distortion gauges 30, which are one type of stress detecting elements, are adopted as the electrical function elements and the three-dimensional electrical unit 10 can be used as stress detecting sensors in this embodiment, not only the single electrical three-dimensional unit 10 itself can be used as a stress detecting sensor, but also the integrated assembly 80 obtained by integrating the three-dimensional electrical units can deal with a wider range of structures to be measured. Specifically, since the integrated assembly 80 as a stress detecting sensor has a mechanical characteristic (rigidity) substantially equal to that of a stress measurement object for which a stress is measured, there are remarkable function and effect that physical stresses acting on the respective three-dimensional electrical units 10 forming the integrated assembly 80 can be stably transmitted in such a state where no residual stress acts. In the case of an occurrence of residual stresses between different stress measurement objects, an inconvenience of hindering stresses transmitted to the respective stress measurement objects can be solved.

The present invention is not limited to the foregoing embodiment and the following modifications are also embraced thereby.

(1) Although the function-element forming surfaces 22 occupy three surfaces of the main body 20 and the wiring surfaces 23 where no distortion gauge 30 is present occupy the remaining three surfaces in the foregoing embodiment, the present invention is not limited to this arrangement, and various surface settings can be adopted. Possible surface arrangements including the one in the foregoing embodiment are listed below.

a) One surface is used as the function-element forming surface 22 and the remaining five surfaces are used as the wiring surfaces 23.

b) Two surfaces are used as the function-element forming surfaces 22 and the remaining four surfaces are used as the wiring surfaces 23.

c) Three surfaces are used as the function-element forming surfaces 22 and the remaining three surfaces are used as the wiring surfaces 23.

d) Four surfaces are used as the function-element forming surfaces 22 and the remaining two surfaces are used as the wiring surfaces 23.

e) Five surfaces are used as the function-element forming surfaces 22 and the remaining one surface is used as the wiring surface 23.

f) All the surfaces are used as the function-element forming surfaces 22.

g) All the surfaces are used as the wiring surfaces 23.

It should be noted the electrical three-dimensional unit 10 having the main body 20 all the surface of which are the wiring surfaces 23, i.e. adopting the surface arrangement g) does not function as a sensor itself, but merely function as an electrically connector.

(2) Although the adhesive retaining particles 60 are imparted to the outer surface of the electrical connector 50 in the foregoing embodiment, the present invention is not limited to the formation of layers of the adhesive retaining particles 60 on the outer surface of the electrical connector 50, and the conductive adhesive may be directly applied to the electrical connector 50.

Figure 7:
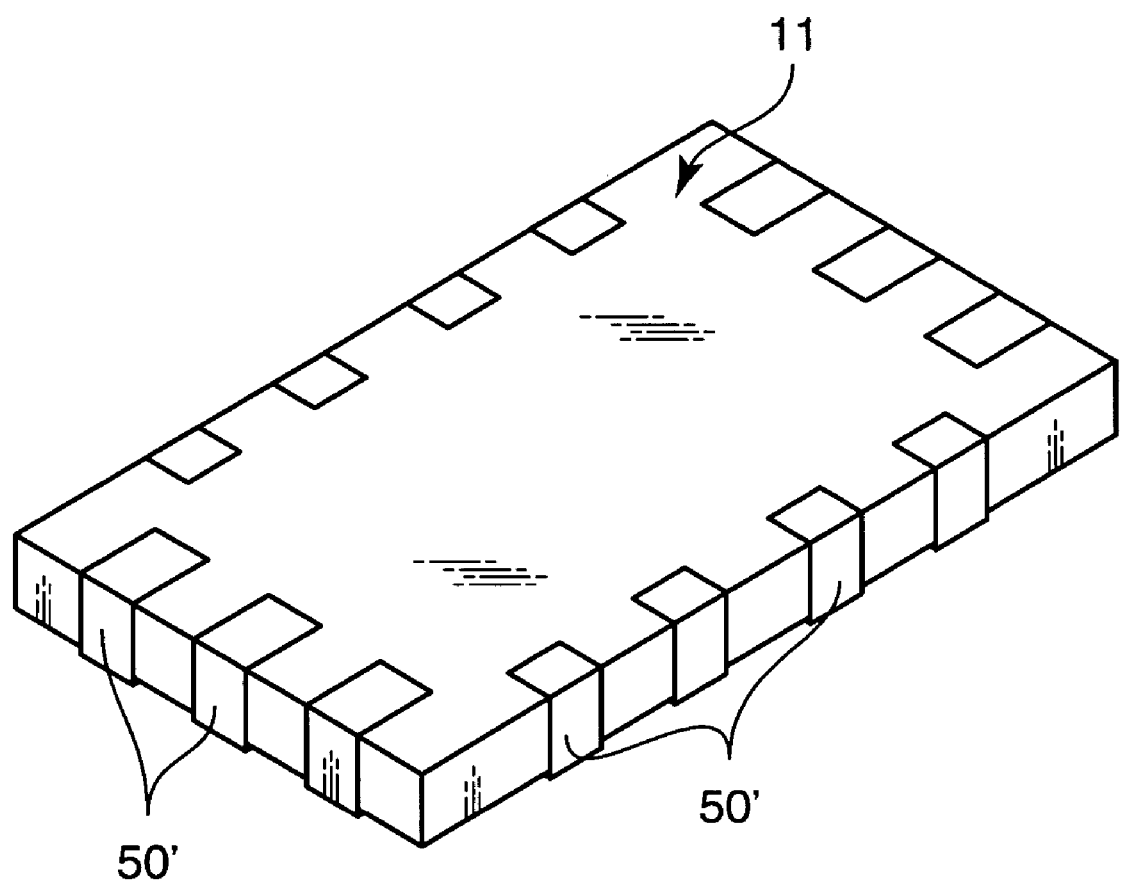
FIG. 7 is a perspective view showing another embodiment of a circuit board to which U-shaped electrical connectors are applied.

(3) In the case that the electrical three-dimensional unit is a flat circuit board 11 having an electrical function element mounted on one or both surfaces thereof as shown in FIG. 7, U-shaped pads 50' formed to hold the front and rear surfaces at the edges of the circuit board 11 can be adopted as the electrical connector. By adopting such U-shaped pads 50', an integrated assembly can be obtained by placing a plurality of circuit boards 11 one over another or by arranging them in a two-dimensionally spanned manner by the connection of the edges.

The circuit board 11 provided with the U-shaped pads 50' shown in FIG. 7 is embraced by the technical scope of the present invention because the circuit board 11 itself is an electrical three-dimensional unit taking a rectangular parallelepipedic shape and the U-shaped pads 50' can be assumed to extend from the respective first surfaces toward the second surfaces while taking an L-shape as a whole and to have the leading ends thereof united on the edge surfaces in the case that the upper and lower surfaces of the circuit board 11 in FIG. 7 are assumed to serve as the first surface 22 on which a function-element is formed and the edge surfaces of the circuit board 11 are assumed to serve as the second surface 23 on which a wiring is formed.

As described above, an inventive electrical connector includes a conductive body made of a conductive material. The conductive body has a land contact surface operable to come into contact with a land formed at an end of a wiring. An adhesive layer is provided on a surface opposite to the land contact surface. The adhesive layer may be preferably provided with a number of adhesive retaining particles. Each adhesive retaining particle has a conductive adhesive and a cover covering the conductive adhesive. The adhesive retaining particle may be preferably breakable owing to a compressing pressure. These electrical connectors are useful to connect lands electrically because of the adhesive layer.

An inventive connection construction for electrical units for electrically joining one and the other three-dimensional electrical units taking a substantially rectangular shape, provided with electrical function elements at specified positions and having at least the outer surfaces thereof made of an electrically nonconductive material with joint surfaces thereof opposed to each other. An electrically conductive wiring pattern electrically connected with the electrical function element is formed on a first surface of each electrical three-dimensional unit and is extended to an edge formed between the first surface and an adjacent second surface as the joint surface, thereby forming a first land; a second land extending from the edge by a specified distance is formed at a position of the second surface corresponding to the first land; and a connection layer displaying a joining performance upon being pressed together is formed to bridge the first and second lands while being held in close contact with the first and second lands.

With the connection construction, if the respective electrical units are pressed in directions toward each other with the second surface as the joint surface of one electrical three-dimensional unit and the second surface of the other electrical three-dimensional unit opposed to each other and with the opposing connection layers of these electrical unit held in contact with each other, the connection layers held in contact are joined with each other since they are made of such a material that displays a joining performance upon being pressed. Thus, the respective electrical units are electrically and structurally connected via the connection layers to be united.

With the adjacent electrical units united, a signal outputted from the electrical function element provided on the first surface of one electrical three-dimensional unit is, for example, transmitted to the other electrical three-dimensional unit via the wiring pattern, the first land at the leading end of the wiring pattern and the connection layer. In this way, signals can be transmitted and received between the one and other electrical unit, and can be introduced to specified output end positions by the transmission through these electrical units.

A plurality of electrical units are united by pressing the respective connection layers held in contact in directions toward each other at a temperature, for example, around normal temperature to join them together without heating them as in the prior art. Thus, there is no likeliness of voids and heat corrosion which are caused by heating the electrical units, and the electrical function elements mounted on the electrical unit are not adversely affected, with the result that a plurality of electrical units can be securely electrically connected with each other with high precision.

Although the presence of the electrical function element on the second surface as the joint surface of the electrical three-dimensional unit is not particularly specified, this neither specifies the absence of the electrical function element on the second surface nor denies the presence of the electrical function element on the second surface as well as on the first surface. In other words, an electrical function element may be provided on the second surface.

Preferably, a third land corresponding to the first land is formed on a third surface which is at least one of the three surfaces adjacent to the first surface except the second surface; a fourth land corresponding to the second land is formed on the first land; and a connection layer made of the same material as the connection layer is provided over the third and fourth lands.

With this connection construction, the first surface of the electrical three-dimensional unit provided with the electrical function element functions as the joint surface, whereby the opposing surfaces of the adjacent electrical unit are used as mount spaces for the electrical function elements. Thus, a mounting rate of the electrical function elements per electrical three-dimensional unit is improved, enabling the multi-functional use of the electrical unit.

Preferably, the thickness of the connection layer is set to be at least larger than that of the electrical function element.

With this connection construction, the mutual interference of the electrical function elements mounted on the opposing surfaces of the electrical units joined with each other can be prevented, thereby avoiding bad influences caused by such a mutual interference.

Preferably, the wiring pattern is made of any one of aluminum, nickel and copper, and the connection layer is made of gold or an indium-tin alloy.

With this connection construction, since aluminum, nickel and copper are all suitable as the material of the wiring pattern, the wiring pattern can be easily and securely formed on the outer surface of the electrical three-dimensional unit. Further, gold and the indium-tin alloy have such a property as to join with each other upon being pressed into contact even without being placed in a high-temperature atmosphere. Thus, a plurality of electrical units placed side by side in a substantially normal-temperature atmosphere are pressed in such directions as to be brought into close contact, whereby the adjacent electrical units can be easily joined with each other via the connection layers. Therefore, the operability in connecting the electrical unit can be improved.

Preferably, protection layers made of an insulating material are formed on the respective surfaces of each electrical three-dimensional unit.

With this connection construction, since the protection layers made of the insulating material are formed on the respective surfaces of the electrical unit, the electrical function elements, the wiring patterns and the like mounted on the outer surfaces can be protected from external forces, thereby securely preventing damages caused by abrasion or the like.

Preferably, the protection layers are made of silicon oxide or silicon nitride.

With this connection construction, since both silicon oxide and silicon nitride can form a coating having a solid reticulate structure by chemical bonding, the protection layers made of such a material can securely protect the electrical function elements formed on the outer surfaces of the electrical unit.

Preferably, a conductive adhesive layer is formed on the connection layer.

With this connection construction, since the respective connection layers held in contact with the electrical units placed adjacent to each other are adhered to each other by the conductive adhesive, the respective electrical units are more strongly united. Further, electrical conductivity between the opposing connection layers can be ensured by the conductive adhesive.

Preferably, adhesive retaining particles containing a conductive adhesive inside are transferred to or printed on the outer surface of the connection layer.

With this connection construction, by performing such an operation as to break the adhesive retaining particles tightly held between the respective connection layers of the adjacent electrical units, the conductive adhesive contained inside flows out of the adhesive retaining particles to be located between the opposing connection layers. The opposing connection layers can be united by the adhesion of the conductive adhesive. Further, electrical conductivity between the opposing connection layers can be ensured by the conductive adhesive.

Preferably, the adhesive retaining particles are broken upon being pressed or vibrated.

With this connection construction, the adhesive retaining particles can be easily broken by pressing or vibrating the adhesive retaining particles tightly held between the respective connection layers of the adjacent electrical unit via the connection layers, whereby the conductive adhesive contained inside can easily flow out.

An inventive connection construction is adapted for electrical units for electrically joining one and another electrical unit taking a substantially rectangular parallelepipedic shape, provided with electrical function elements at specified positions and having at least the outer surfaces thereof made of an electrically nonconductive material with joint surfaces thereof opposed to each other, wherein an electrically conductive wiring pattern electrically connected with the electrical function element is formed on a first surface of each electrical three-dimensional unit and is extended to an edge formed between the first surface and an adjacent second surface as the joint surface, thereby forming a first land; a second land extending from the edge by a specified distance is formed at a position of the second surface corresponding to the first land; a connection layer displaying a joining performance upon being pressed together is formed to bridge the first and second lands while being held in close contact with the first and second lands; and particulate adhesive retaining particles containing a conductive adhesive are transferred to or printed on the outer surface of the connection layer and are broken upon being pressed or vibrated.

With this connection construction, the same functions and effects as the connection constructions can be obtained.

An inventive electrical unit comprises a main body having a rectangular shape; a first wiring pattern formed on a first surface of the main body, the first wiring pattern having a first land near an edge of the main body; a second wiring pattern formed on a second surface of the main body, the second wiring pattern having a second land near an edge of the main body; an electrical connector attached on the first and second lands for electrically connecting the first wiring pattern and the second wiring pattern, the electrical connector including an adhesive layer on an outer surface thereof.

The inventive electric device is constructed by integrating a plurality of electrical units using the inventive electrical connectors. The connection layer of the other electrical three-dimensional unit is brought and pressed into contact with that of the one electrical three-dimensional unit, thereby integrating the plurality of electrical units to construct the integrated assembly.

Since this integrated assembly or the electrical device is constructed by integrating a plurality of electrical units, the electrical units can be two-dimensionally or three-dimensionally combined in conformity with the shape of a structure to be measured, thereby building the integrated assembly in conformity with the structure. This enables a geometrically progressive improvement in detection precision which could not be obtained by one electrical three-dimensional unit, and can increase items to be detected or enlarge a detection range.

Preferably, a conductive adhesive layer is provided between the connection layer of the one electrical three-dimensional unit and that of the other electrical three-dimensional unit.

With this integrated assembly, while the more secure joint of the adjacent electrical units is realized by the conductive adhesive provided between the opposing electrical units, the electrical units can be securely electrically connected.

Preferably, the conductive adhesive layer is made of a conductive adhesive contained in adhesive retaining particles and obtained when the adhesive retaining particles are broken upon being pressed or vibrated in a state thereof transferred to or printed on the connection layers.

With this integrated assembly, by performing such an operation as to break the adhesive retaining particles tightly held between the respective connection layers of the adjacent electrical units, i.e. by pressing or vibrating the adhesive retaining particles, the conductive adhesive contained in the adhesive retaining particles flows out to be located between the opposing connection layers. Thus, the opposing connection layers can be united by the adhesion of the conductive adhesive. Further, electrical conductivity between the opposing connection layers can be ensured by the conductive adhesive.

Preferably, an insulating material is filled between the one and the other electrical units joined with each other.

With this integrated assembly, electrical shorting between the electrical units can be prevented by the insulating material present between the adjacent electrical units.

Preferably, the electrical function element is a stress detecting element for detecting a stress or a distortion acting on a specified structure, and the insulating material has a mechanical strength substantially equal to that of the electrical unit body.

With this integrated assembly, by mounting a stress detecting element as one type of the electrical function element on the outer surface of the electrical three-dimensional unit, the integrated assembly obtained by integrating the electrical unit functions as a stress detecting sensor by being embedded in a structure for which stress is to be measured. Further, by using a material having substantially the same mechanical strength as the electrical unit such as an epoxy resin as the insulating material to be provided between the electrical unit, the integrated assembly is suitable for a stress detecting sensor used under severe conditions since a plurality of electrical unit are united also in terms of strength.

Preferably, the electrical function element is a stress detecting element for detecting a stress or a distortion acting on a specified structure, and the insulating material has such a rigidity as to enable the transmission of a stress acting on the specified structure.

With this integrated assembly, by mounting the electrical function elements or stress detecting elements as some of the electrical function elements represented by distortion gauges on the outer surfaces of the electrical unit, the integrated assembly obtained by integrating the electrical units can function as a stress detecting sensor by being embedded in a structure for which stress is to be measured. Further, by using a material having substantially the same mechanical characteristic or rigidity as the electrical unit or a specified structure or stress measurement object such as an epoxy resin as the insulating material to be provided between the electrical units, electrical shorting between the adjacent electrical units can be prevented, and physical stresses acting on the plurality of electrical units can be so stably transmitted as to create no residual stress. Thus, the detection precision of the integrated assembly can be remarkably improved. Furthermore, since the electrical unit as a plurality of stress detecting sensors are united by being coupled to each other via the insulating material having substantially the same rigidity, their detection precision can be improved and detection values of the respective stress detecting sensors can be added to remarkably strengthen a detection ability.

An inventive production method for producing an electrical device, comprises the steps of: preparing a plurality of electrical units, each electrical unit being made by: forming a main body having a rectangular shape; forming an electrical function element and a first wiring pattern connected with the electrical function element on a first surface of the main body, the first wiring pattern having a first land near an edge of the main body; forming a second wiring pattern on a second surface of the main body, the second wiring pattern having a second land near an edge of the main body; attaching an electrical connector on the first and second lands for electrically connecting the first wiring pattern and the second wiring pattern, the electrical connector including an adhesive layer on an outer surface thereof, the adhesive layer including a number of adhesive retaining particles, each adhesive retaining particle having a conductive adhesive and a cover covering the conductive adhesive and breakable owing to a predetermined compressing pressure; placing a plurality of electrical units in a predetermined arrangement; pressing the plurality of electrical units to each other in such a pressure that the adhesive retaining particles break out and the adhesive leaks, whereby the plurality of electrical units are connected with each other by the adhesive.

Further, a resin may be preferably injected into a clearance between the opposing electrical units.

With this production method, the inventive electrical device can be easily produced merely by pressing electrical units to each other without formation of voids and an occurrence of heat corrosion in the electrical units. Consequently, bad influences on electrical function elements mounted on the electrical unit can be prevented to enable the secure and easy electrical connection of a plurality of three-dimensional electrical units with high precision.

This application is based on patent application No. 2003-202198 filed in Japan, the contents of which are hereby incorporated by references.

Although the present invention has been fully described by way of example with reference to the accompanied drawings, it is to be understood that various changes and modifications will be apparent to those skilled in the art. Therefore, unless otherwise such changes and modifications depart from the scope of the present invention hereinafter defined, they should be construed as being included therein.

What is claims is:

1. An electrical unit comprising:
   a main body having a rectangular shape;

a first wiring pattern formed on a first surface of the main body, the first wiring pattern having a first land near an edge of the main body;

a second wiring pattern formed on a second surface of the main body, the second wiring pattern having a second land near an edge of the main body;

an electrical connector attached on the first and second lands for electrically connecting the first wiring pattern and the second wiring pattern, the electrical connector including an adhesive layer on an outer surface thereof, the adhesive layer being operable to expose a conductive adhesive owing to an external force.

2. An electrical unit according to claim 1, wherein the adhesive layer includes a number of adhesive retaining particles, each adhesive retaining particle having a conductive adhesive and a cover covering the conductive adhesive.

3. An electrical unit according to claim 2, wherein the adhesive retaining particle is breakable owing to an external force.

4. An electrical unit according to claim 1, wherein the first surface is provided with an electrical function element, the first wiring pattern is directly connected with the electrical function element.

5. An electrical unit according to claim 4, wherein the electrical connector has a thickness larger than the electrical function element.

6. An electrical unit according to claim 1, wherein the wiring pattern is made of any one of aluminum, nickel and copper, and the electric connector is made of gold or an indium-tin alloy.

7. An electrical unit according to claim 1, wherein a surface of the main body is formed with a protection layer made of an insulating material.

8. An electrical unit according to claim 7, wherein the insulating material is a silicon oxide or a silicon nitride.

9. An electrical device comprising:
a plurality of electrical units, each electrical unit including:
a main body having a rectangular shape;
a first wiring pattern formed on a first surface of the main body, the first wiring pattern having a first land near an edge of the main body;
a second wiring pattern formed on a second surface of the main body, the second wiring pattern having a second land near an edge of the main body;
an electrical connector attached on the first and second lands for electrically connecting the first wiring pattern and the second wiring pattern, the electrical connector including an adhesive layer on an outer surface thereof, the adhesive layer being operable to expose a conductive adhesive owing to an external force.

10. An electrical device according to claim 9, wherein an electrical unit is provided with an electrical function element on a first surface thereof.

11. An electrical device according to claim 10, wherein the electrical function element is a stress detecting element for detecting a stress or a distortion acting on a specified structure.

12. An electrical device according to claim 9, wherein an insulating resin is filled between the adjacent electrical units.

13. An electrical device according to claim 12, wherein the insulating resin has a mechanical strength equal to that of the main body.

14. An electrical device according to claim 12, wherein the insulating resin has a rigidity capable of transmitting a stress acting on a specified structure.

15. A method for producing an electrical device, comprising the steps of:
preparing a plurality of electrical units, each electrical unit being made by:
forming a main body having a rectangular shape;
forming an electrical function element and a first wiring pattern connected with the electrical function element on a first surface of the main body, the first wiring pattern having a first land near an edge of the main body;
forming a second wiring pattern on a second surface of the main body, the second wiring pattern having a second land near an edge of the main body;
attaching an electrical connector on the first and second lands for electrically connecting the first wiring pattern and the second wiring pattern, the electrical connector including an adhesive layer on an outer surface thereof, the adhesive layer including a number of adhesive retaining particles, each adhesive retaining particle having a conductive adhesive and a cover covering the conductive adhesive and breakable owing to a predetermined compressing pressure;
placing a plurality of electrical units in a predetermined arrangement;
pressing the plurality of electrical units to each other in such a pressure that the adhesive retaining particles break out and the adhesive leaks, whereby the plurality of electrical units are connected with each other by the adhesive.

16. A method according to claim 15, further comprising the step of injecting a resin into a clearance between the opposing electrical units.

* * * * *